(12) United States Patent
Wang et al.

(10) Patent No.: US 6,577,661 B1
(45) Date of Patent: Jun. 10, 2003

(54) SEMICONDUCTOR LASER WITH LATERAL LIGHT CONFINEMENT BY POLYGONAL SURFACE OPTICAL GRATING RESONATOR

(75) Inventors: Wang-Nang Wang, Bath (TW); Yury Georgievich Shreter, Petersburg (GB); Yury Toomasovich Rebane, Petersburg (GB)

(73) Assignee: Arima Optoelectronics Corp., Tao-Yuan Hsien (TW)

( * ) Notice: Subject to any disclaimer, the term of this patent is extended or adjusted under 35 U.S.C. 154(b) by 0 days.

(21) Appl. No.: 09/683,801

(22) Filed: Feb. 18, 2002

(51) Int. Cl.$^7$ ................................................... H01S 5/20

(52) U.S. Cl. .......................................... 372/45; 372/96

(58) Field of Search .............................. 372/96, 45, 50, 372/102, 46

(56) References Cited

U.S. PATENT DOCUMENTS 6,292,503 B1 * 9/2001 Wantanabe et al. ............ 372/45
6,301,283 B1 * 10/2001 Chen et al. .................... 372/96

* cited by examiner

Primary Examiner—James Davie
(74) Attorney, Agent, or Firm—Winston Hsu

(57) ABSTRACT

A semiconductor laser with lateral optical cavity based on III-V or II-VI semiconductor compounds and their alloys is suggested. The essence of the disclosure is in the use of polygonal surface optical grating resonator (PGR) for lateral confinement of the light and selective excitation of the chosen optical mode. PGR allows fabricating of single mode semiconductor lasers needed for various applications such as CD and DVD pick up heads, high quality laser printers and others. Also, PGR allows controlled multiple wavelength operation of semiconductor lasers needed for telecommunication purposes. The technological advantage of PGR over traditional mesa-structure or ridge optical cavity resonators is in simplicity of integration of surface optical grating fabrication process into planar semiconductor technology.

33 Claims, 11 Drawing Sheets

SEMICONDUCTOR LASER WITH LATERAL LIGHT CONFINEMENT BY POLYGONAL SURFACE OPTICAL GRATING RESONATOR

BACKGROUND OF INVENTION

1. Field of the Invention

The present invention relates to a semiconductor laser. More particularly, the invention relates to a semiconductor laser with a lateral optical cavity based on III-V and II-VI semiconductor compounds and their alloys.

2. Description of the Prior Art

Semiconductor laser diodes with various shapes of lateral laser cavities such as micro-disk, equilateral triangle, micro-arc-ring, triangular ridge, L-shape ridge, U-shape ridge and bow-tie lasers are known, e.g. CN1267106.

In all these lasers surface mesa structures of various shapes are used for lateral light confinement.

However, the light reflections at the sides of mesa structures are not wavelength sensitive. These makes the surface mesa-structure-based optical resonators non-selective with respect to the different lateral optical modes and prevents fabrication of semiconductor lasers operating in a single mode or controlled multiple mode regimes.

Meanwhile, many applications require single mode or controllable multiple mode operation of semiconductor laser.

The present invention states semiconductor lasers with polygonal surface optical grating resonator (PGR) for lateral confinement of the light which allows selective excitation of the chosen optical mode or modes needed for various applications such as CD and DVD pick up heads, high quality laser printers and others.

Also, PGR allows controlled multiple wavelength operation of semiconductor lasers needed for telecommunication purposes.

SUMMARY OF INVENTION

It is an object of the present invention to provide a semiconductor laser which can operate in single mode or controllable multiple mode regimes.

DETAILED DESCRIPTION

Figure 1:
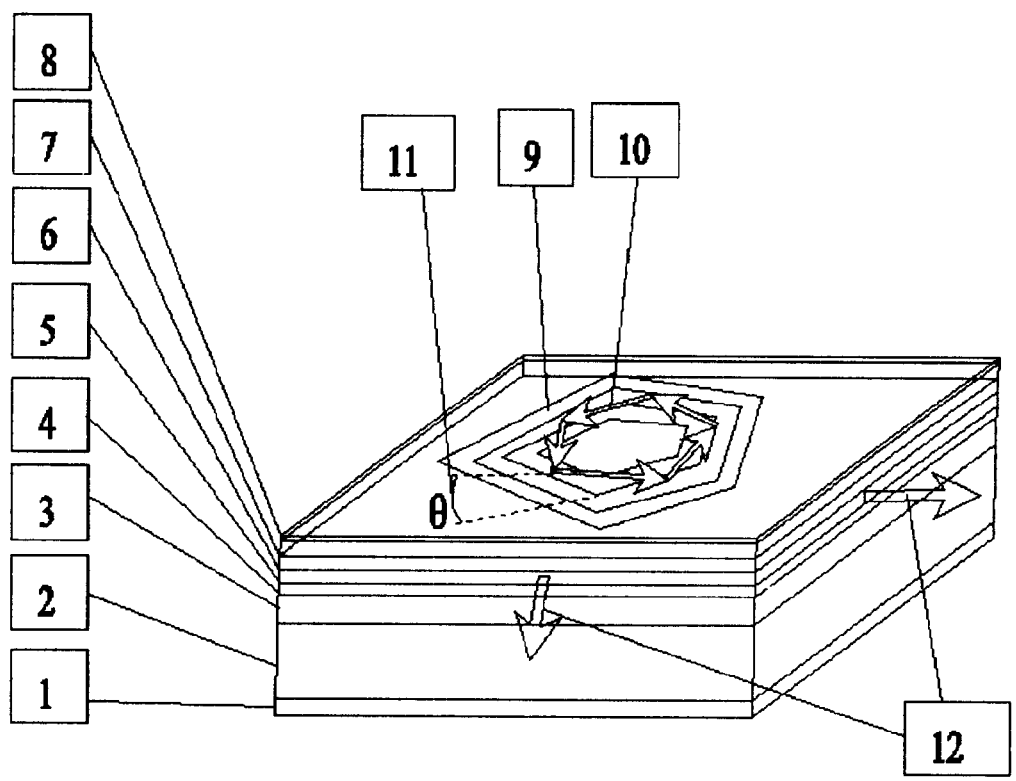
FIG. 1 exhibits the principal structure of a PGR semiconductor laser.

This invention states a semiconductor laser having polygonal surface optical grating resonator (PGR). The principal structure of a PGR semiconductor laser is shown in FIG. 1.

It consists of a lower contact 1 to a conducting substrate 2, a lower contact layer 3, made of doped semiconductor, a high-index semiconductor wave-guiding layer 5, a lower wave-guiding mirror 4, made of an low-index semiconductor cladding layer or a superlattice, an upper wave-guiding mirror 6, made of an low-index cladding layer or superlattice, an upper contact layer 7, made of doped semiconductor, an upper contact made of thin metallic layer 8 and a PGR with polygonal optical gratings 9 made before upper contact deposition by relief etching on the surface or deposition of metal or dielectric stripes on the surface with use of lithography.

The wave-guiding layer 5 contains an active layer, made a double hetero-structure or a single quantum well or multiple quantum wells.

The light ray path is shown schematically 10. An effective light reflection occurs for incident light rays propagating at Bragg angle Θ 11 only. Lateral light confinement is achieved when sum of Bragg angles for all optical gratings is equal to $2\pi$.

The light can be outputted in several directions 12, some of which can be used for light power monitoring.

Figure 2:
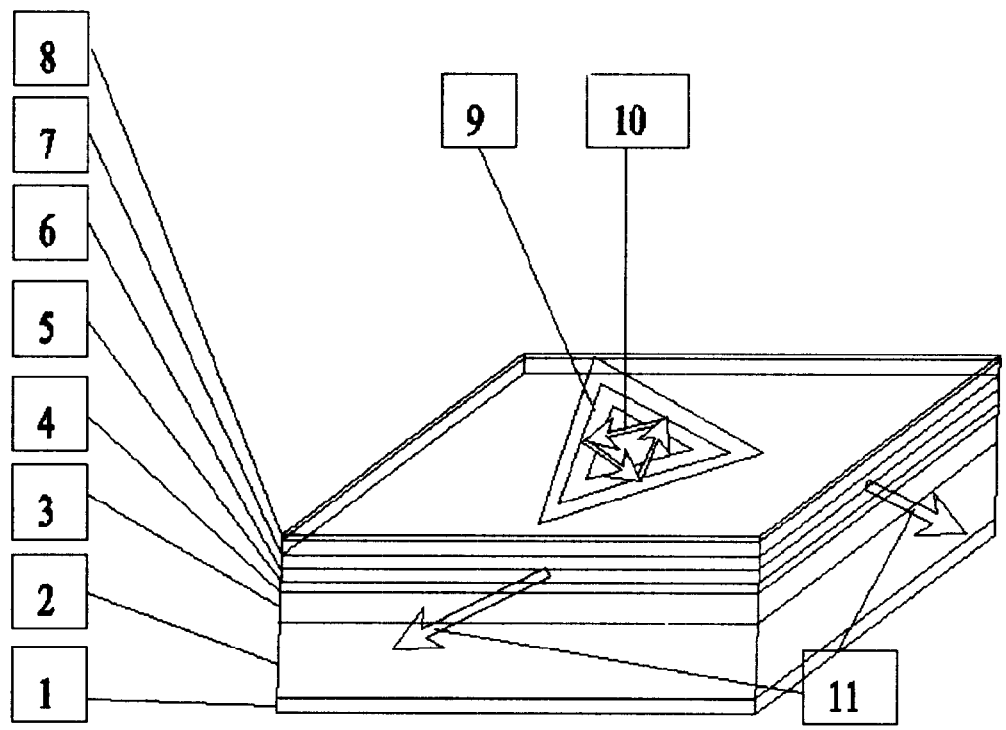
FIG. 2 exhibits a PGR semiconductor laser with three optical gratings.
Figure 3:
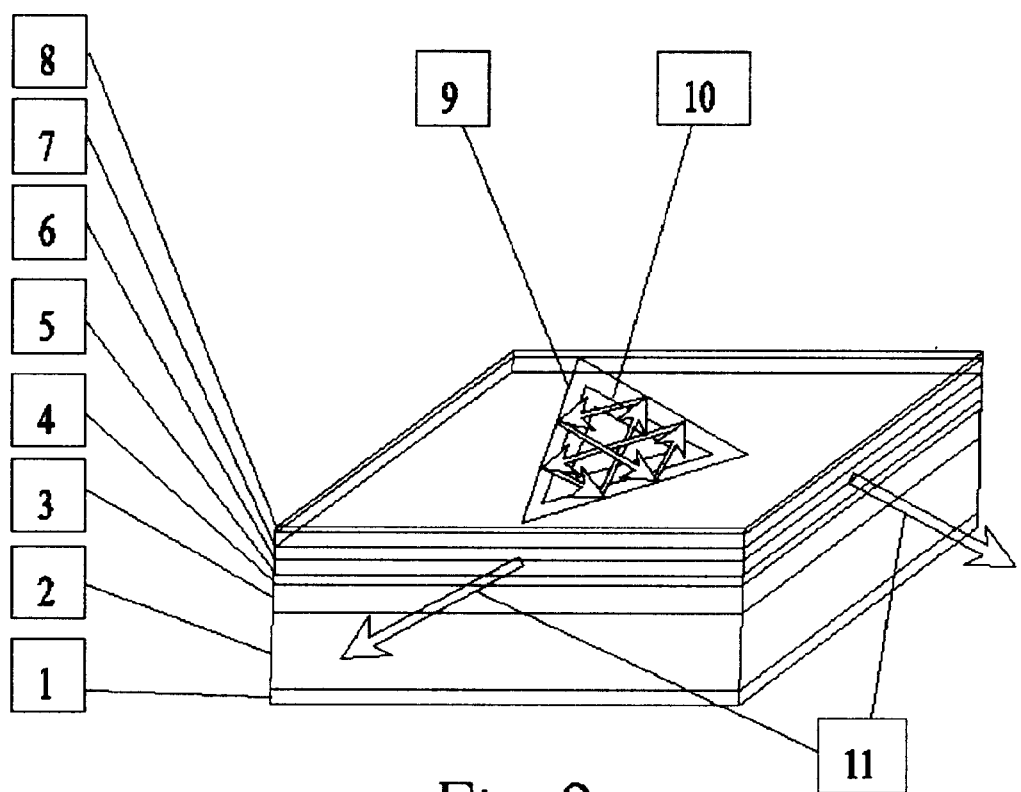
FIG. 3 shows optical ray paths going through the centre of a PGR semiconductor laser with three optical gratings.

In a simplest case PGR semiconductor laser has three optical gratings. The corresponding confined light rays are shown in FIG. 2 and FIG. 3 for the cases when light intensity is zero or maximal at the triangle centre respectively.

The active layer of PGR semiconductor laser can be made of III-V or II-VI semiconductor double heterostructure, single quantum well, multiple quantum wells or current asymmetric resonance tunnelling structure stated in GB2352326.

The optical cavity of PGR semiconductor laser is made of lateral waveguide consisting of II-V or II-VI semiconductor heterostructure or double heterostructure or index-graded structure or superlattice structure or another waveguiding structure for vertical confinement of the light and a polygonal surface optical grating resonator for lateral confinement of the light and selection of optical modes. The surface optical grating can be made as a relief etched on the surface or by deposition of metal or dielectric stripes on the surface.

The selection of optical modes arises because of the optical grating reflects efficiently only the light propagating at a Bragg angle Θ, FIG. 1., given by $$2d\sin\Theta = N\lambda/n \quad (1)$$

where d is the period of the surface grating, N is a natural number determining the order of reflection, $\lambda$ is wavelength of the light and n is the effective refraction index for the lateral propagation of the light in the layered semiconductor structure.

The condition for the effective lateral confinement of the light in the polygonal surface optical grating resonator is $$\sum_{i=1}^{P} \theta_i = \pi \qquad (2)$$

where P is the number of surface optical gratings in PGR and $\Theta_i$ is the Bragg angle for the surface optical grating with index i.

For a selected optical mode with wavelength λ this condition gives $$\sum_{i=1}^{P} \sin^{-1}(N_i \lambda / 2 d_i n) = \pi \qquad (3)$$

where $d_i$ and $N_i$ are the period and the order of reflection for the surface optical grating with index i.

Using Eq.(3) it is possible to fit the values of $d_i$ to make the Eq.(3) valid for an optical mode with selected wavelength λ in PGR.

For equilateral triangle PGR Eq.(3) transforms into $$d = N\lambda / \sqrt{3} n \qquad (4)$$

For square PGR Eq.(3) gives $$d = N\lambda / \sqrt{2} n \qquad (5)$$

For equilateral hexagon PGR Eq.(3) gives $$d = N\lambda / n \qquad (6)$$

It can be seen from Eqs.(4–6) that wavelengths of the optical modes corresponding to the first and second orders of reflection from the surface optical gratings differs by the factor of two. This difference is very high and allows easily to make the PGR lasers operating in single mode regime via fitting the spectral dependence of the optical gain.

Figure 6:
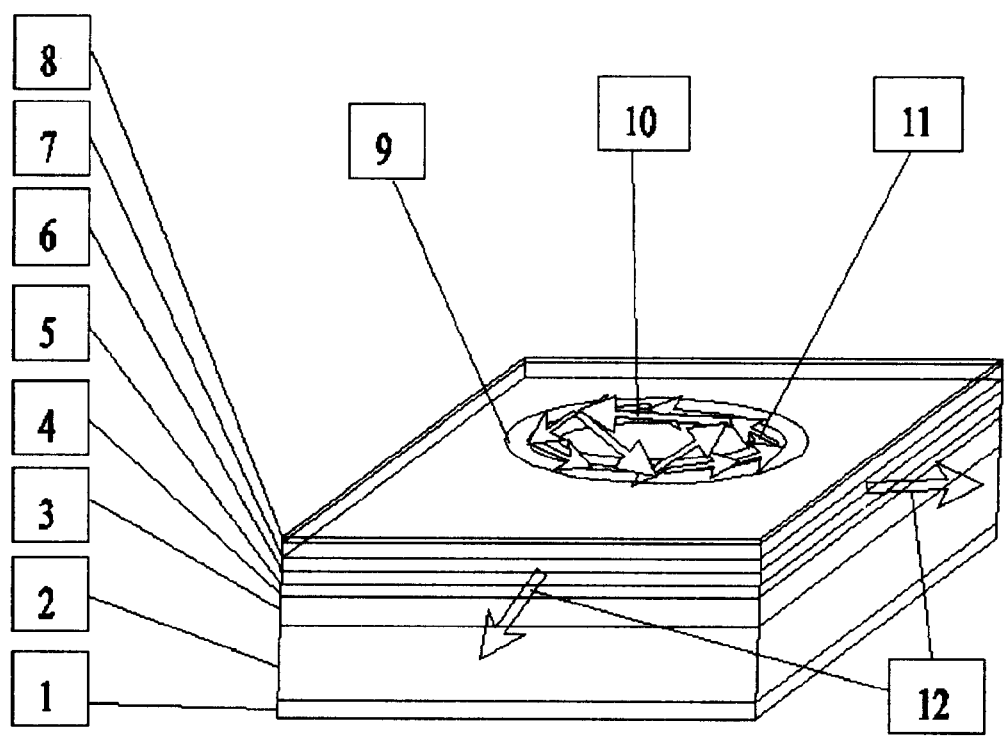
FIG. 6 exhibits a PGR semiconductor laser with a circular optical grating resonator in which multiple modes can exist.
Figure 7:
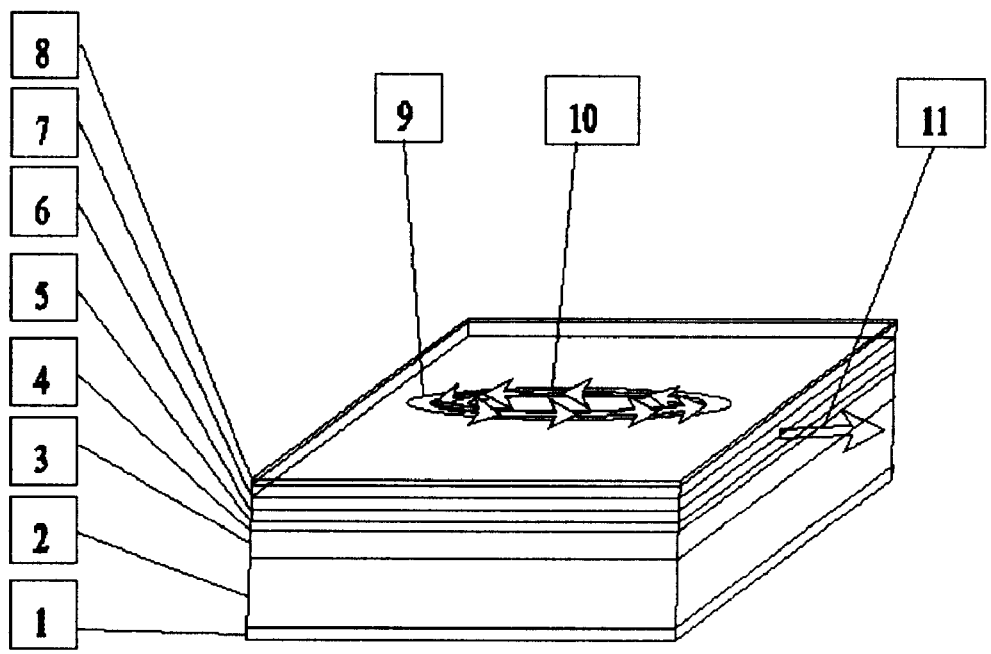
FIG. 7 exhibits a PGR semiconductor laser with a circular optical grating resonator having an elliptical distortion to make it operating in single mode regime FIG. 8 exhibits the principal structure of a mesa-structure PGR semiconductor laser.

In a limiting case of infinite number of apexes PGR becomes a circular optical grating resonator in which multiple modes can exist FIG. 6. For selection of a chosen optical mode a small asymmetry can be added to the circular optical grating resonator. For example, an elliptical distortion of the circular optical grating resonator allows to make it operating in single mode regime FIG. 7.

In PGR mesa-structures the light reflection from surface optical gratings can be combined with total reflection from the sides of mesa-structures.

Figure 8:
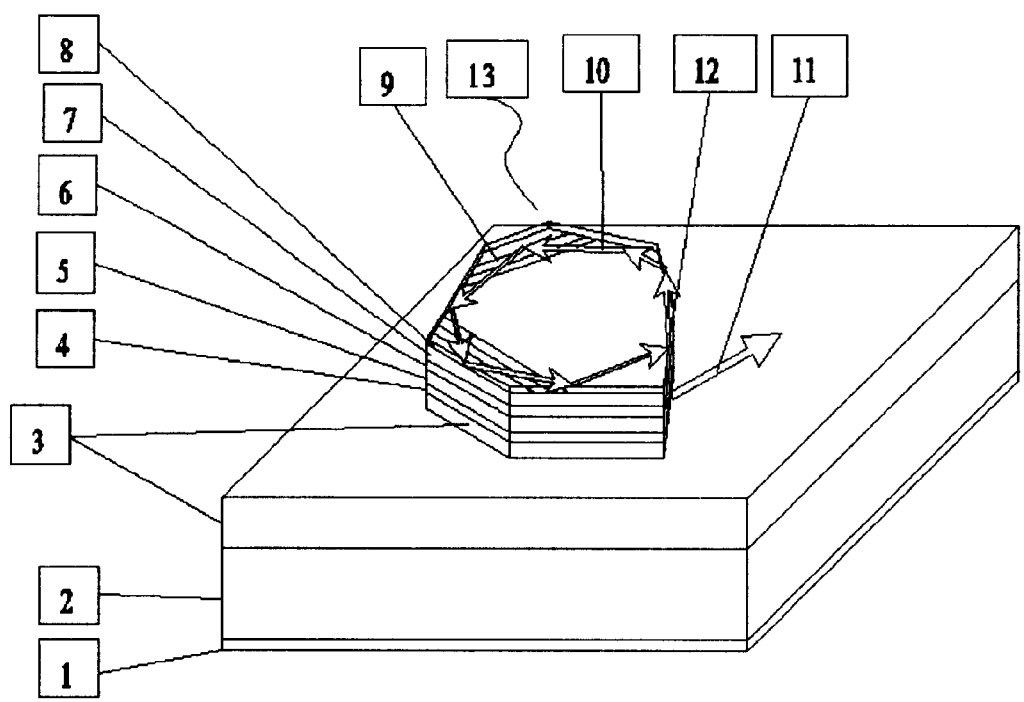

The principal structure of a mesa-structure PGR semiconductor laser grown on a conducting substrate is shown in FIG. 8.

It consists of a lower contact 1 to a conducting substrate 2, a lower contact layer 3, made of doped semiconductor, a high-index semiconductor wave-guiding layer 5, a lower wave-guiding mirror 4, made of an low-index semiconductor cladding layer or a superlattice, an upper wave-guiding mirror 6, made of an low-index cladding layer or superlattice, an upper contact layer 7, made of doped semiconductor, an upper contact made of thin metallic layer 8 and a mesa-structure PGR 13 which combines light reflection from surface optical gratings 9 and total reflection from the sides of mesa-structure 12. The optical gratings are made before upper contact deposition by relief etching on the top of mesa-structure or deposition of metal or dielectric stripes on the top of mesa-structure with use of lithography.

The wave-guiding layer 5 contains an active layer, made a double hetero-structure or a single quantum well or multiple quantum wells.

The light ray path is shown schematically 10. The light can be outputted in several directions 11, some of which can be used for light power monitoring.

Figure 9:
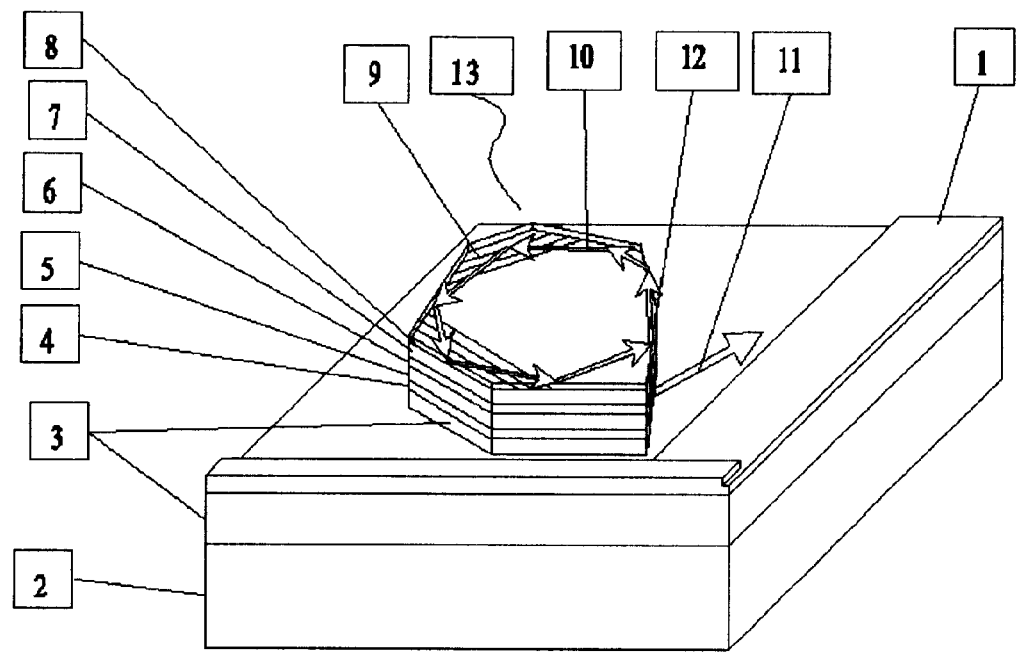
FIG. 9 exhibits a mesa-structure PGR semiconductor laser with P=R=1.

The principal structure of a mesa-structure PGR semiconductor laser grown on an insulating substrate is shown in FIG. 9.

It has the same elements as the mesa-structure PGR semiconductor laser grown on a conducting substrate shown in FIG. 8 except lower electrode 1 is deposited on the top of the semiconductor structure surface in vicinity of the PGR mesa-structure 13.

An effective light reflection occurs for incident light rays propagating at Bragg angle Θ only and this leads to the following condition for the selection of the optical modes in the mesa-structure PGRs $$\sum_{i=1}^{P} \sin^{-1}\left(\frac{N_i \lambda}{2 d_i n}\right) - \sum_{i=1}^{R} \phi_i = \pi(1 - R) \qquad (7)$$

P is the number of surface optical gratings in PGR and R is the number of reflecting apexes in the mesa-structure, $\phi_i$ is the angle of the i-th reflecting apex, of the mesa-structure.

In most interesting case of the mesa-structure with P=R=1 (FIG. 10 and FIG. 11), the right hand side of Eq. (7) is zero and it gives the corresponding optical grating period d the following expression $$d = N\lambda / 2n \sin \phi \qquad (8)$$

In a particular case N=1 and φ=30° Eq.(8) gives $$d = \lambda / n \qquad (9)$$

In a particular case N=1 and φ=45° Eq.(8) gives $$d = \lambda / \sqrt{2} n \qquad (10)$$

In a particular case N=1 and φ=60° Eq.(8) gives $$d = \lambda / \sqrt{3} n \qquad (11)$$

In a particular case N=1 and φ=90° Eq.(8) gives $$d = \lambda / 2n \qquad (12)$$

Use of Eqs.(1–12) allows to design PGR-lasers operating in single mode regime or controlled multiple wavelength regime.

Single mode operating PGR-lasers are needed for various applications such as CD and DVD pick up heads, high quality laser printers and others.

Multiple wavelength operating PGR-lasers are needed for telecommunication purposes.

The technological advantage of PGR over traditional mesa-structure or ridge optical cavity resonators is in simplicity of integration of surface optical grating fabrication process into planar semiconductor technology.

The invention will be more fully understood by reference to the following examples.

EXAMPLE 1

The principal scheme of triangle PGR semiconductor laser with three optical gratings generating light with wavelength in region 700–1000 nm embodied in Example 1 is shown in FIG. 2 and FIG. 3.

It has a lower electrode 1 to conducting n-GaAs substrate with surface plane orientation (111) 2, a lower contact layer 3, made n-type GaAs, a high-index AlGaAs two-dimensional wave-guiding layer 5, a lower wave-guiding mirror 4, made of an low-index n-type AlGaAs cladding layer or n-type AlGaAs superlattice, an upper wave-guiding mirror 6, made of an low-index p-type AlGaAs cladding layer or p-type AlGaAs superlattice, an upper contact layer made of p-type AlGaAs 7, an upper contact made of thin metallic layer 8 and a PGR with three optical gratings 9 made by relief etching on the surface or deposition of metal or dielectric stripes on the surface with use of lithography.

The wave-guiding layer 4 contains an active layer, made of InGaAs/GaAlAs double hetero-structure or InGaAs/GaAlAs single quantum well or InGaAs/GaAlAs multiple quantum wells wells or current asymmetric resonance tunnelling structure stated in GB2352326.

The light ray confined path 10 and the light output direction 11 are shown schematically.

EXAMPLE 2

Figure 4:
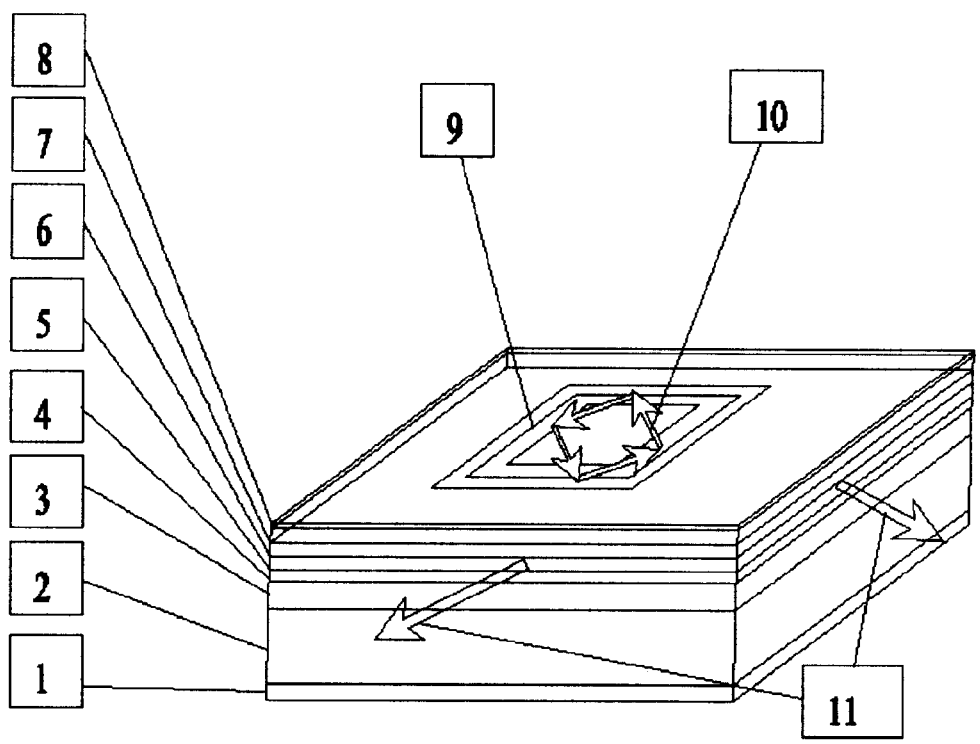
FIG. 4 exhibits a PGR semiconductor laser with four optical gratings.

The principal scheme of square PGR semiconductor laser with four optical gratings generating light with wavelength in region 700–1000 nm embodied in Example 2 is shown in FIG. 4.

It has a lower electrode 1 to conducting n-GaAs substrate with surface plane orientation (001) 2, a lower contact layer 3, made n-type GaAs, a high-index AlGaAs two-dimensional wave-guiding layer 5, a lower wave-guiding mirror 4, made of an low-index n-type AlGaAs cladding layer or n-type AlGaAs superlattice, an upper wave-guiding mirror 6, made of an low-index p-type AlGaAs cladding layer or p-type AlGaAs superlattice, upper contact layer made of p-type AlGaAs 7, an upper contact made of thin metallic layer 8 and a PGR with three optical gratings 9 made by relief etching on the surface or deposition of metal or dielectric stripes on the surface with use of lithography.

The wave-guiding layer 4 contains an active layer, made of InGaAs/GaAlAs double hetero-structure or InGaAs/GaAlAs single quantum well or InGaAs/GaAlAs multiple quantum wells wells or current asymmetric resonance tunnelling structure stated in GB2352326.

The light ray confined path 10 and the light output direction 11 are shown schematically.

EXAMPLE 3

The principal scheme of single mode PGR semiconductor laser with a circular optical grating resonator having an elliptical distortion generating light with wavelength in region 1300 nm or 1550 nm embodied in Example 3 is shown FIG. 6.

It has a lower electrode 1 to conducting n-InP substrate 2, a lower contact layer 3, made n-type InP, a high-index InGaAsP two-dimensional wave-guiding layer 5, a lower wave-guiding mirror 4, made of an low-index n-type InP cladding layer or n-type InGaAsP/InGaAsP superlattice or n-type ALInGaAs/AlInGaAs superlattice AlGaAs cladding layer or n-type AlGaAs superlattice, an upper wave-guiding mirror 6, made of an low-index p-type InP cladding layer or p-type InGaAsP superlattice, upper conact layer made of p-type InP 7, an upper contact made of thin metallic layer 8 and a PGR with elliptical optical gratings 9 made by relief etching on the surface or deposition of metal or dielectric stripes on the surface with use of lithography.

The wave-guiding layer 4 contains an active layer, made of InGaAsP/InGaAsP double hetero-structure or InGaAsP/InGaAsP single quantum well or InGaAsP/InGaAsP multiple quantum wells or current asymmetric resonance tunnelling structure stated in GB2352326.

The light ray confined path 10 and the light output direction 11 are shown schematically.

EXAMPLE 4

Figure 5:
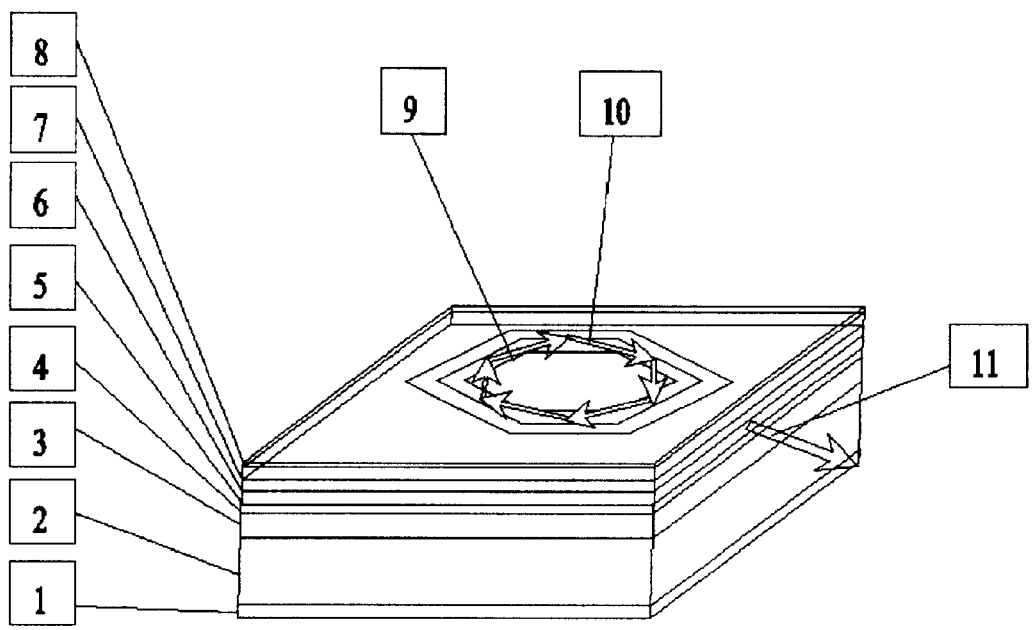
FIG. 5 exhibits a PGR semiconductor laser with six optical gratings.

The principal scheme of hexagonal PGR semiconductor laser with six optical gratings generating light with wavelength in region 400–600 nm embodied in Example 4 is shown in FIG. 5.

It has a lower electrode 1 to conducting n-SiC substrate 2, a lower contact n-GaN layer with surface plane orientation (0001) 3, grown on n-SiC substrate, a high-index InGaN two-dimensional wave-guiding layer 5, a lower wave-guiding mirror 4, made of an low-index n-type AlGaN cladding layer or n-type AlGaN superlattice, an upper wave-guiding mirror 6, made of an low-index p-type AlGaN cladding layer or p-type AlGaN superlattice, upper contact layer made of p-type AlGaN superlattice, an upper conact layer upper contact layer made of p-type 7, an upper contact made of thin metallic layer 8 and a PGR with elliptical optical gratings 9 made by relief etching on the surface or deposition of metal or dielectric stripes on the surface with use of lithography.

The wave-guiding layer 4 contains an active layer, made of InGaN/InGaAlN double hetero-structure, or InGaN/InGaAlN single quantum well, or InGaN/InGaAlN multiple quantum wells or current asymmetric resonance tunnelling structure stated in GB2352326.

The light ray confined path 10 and the light output direction 11 are shown schematically.

EXAMPLE 5

Figure 10:
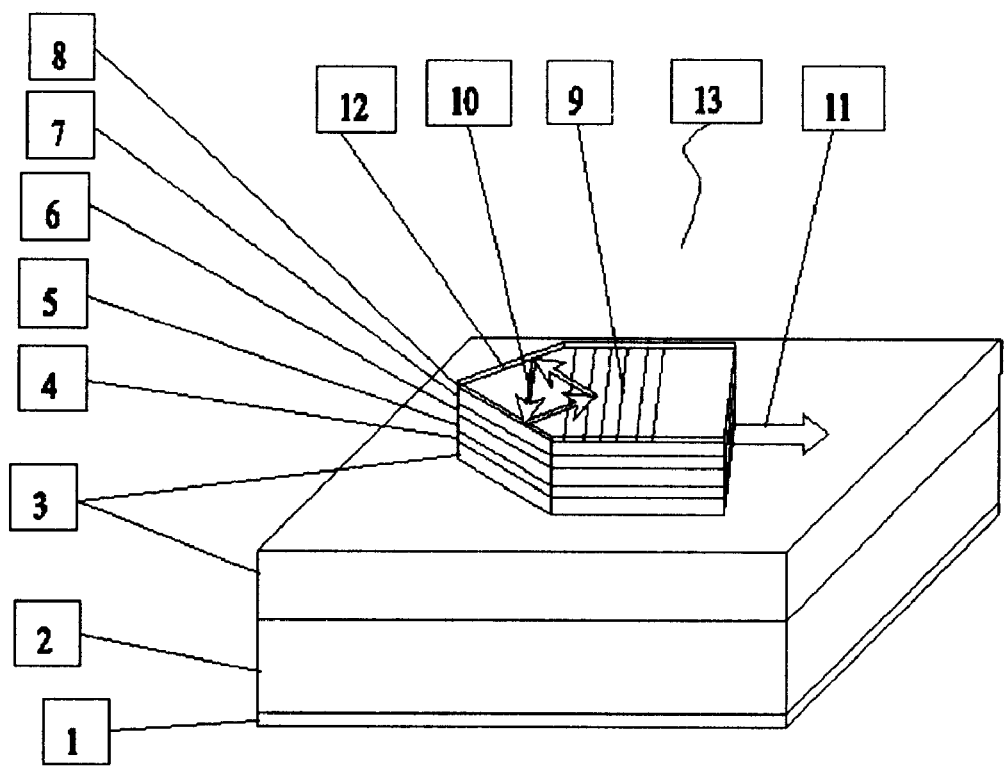
FIG. 10 exhibits another mesa-structure PGR semiconductor laser with P=R=1.

The principal scheme of mesa-structure PGR semiconductor laser with P=R=1 grown on a conducting substrate and generating light with wavelength in region 400–600 nm embodied in Example 5 is shown in FIG. 10.

It is fabricated on the basis of polygonal mesa-structure etched on the surface of a semiconductor wafer and has a lower electrode 1 to conducting n-SiC substrate 2, a lower contact n-GaN layer with surface plane orientation (0001) 3, grown on n-SiC substrate, a high-index InGaN two-dimensional wave-guiding layer 5, a lower wave-guiding mirror 4, made of an low-index n-type AlGaN cladding layer or n-type AlGaN superlattice, an upper wave-guiding mirror 6, made of an low-index p-type AlGaN cladding layer or p-type AlGaN superlattice, upper contact layer made of p-type AlGaN or p-type AlGaN superlattice superlattice, an upper conact layer upper contact layer made of p-type AlGaN layer or p-type AlGaN superlattice 7, an upper contact made of thin metallic layer 8 and optical grating 9 with period given in Eqs. (7–12) made by relief etching on the surface or deposition of metal or dielectric stripes on the surface with use of lithography.

The wave-guiding layer 4 contains an active layer, made of InGaN/InGaAlN double hetero-structure, or InGaN/

InGaAlN single quantum well, or InGaN/InGaAlN multiple quantum wells or current asymmetric resonance tunnelling structure stated in GB2352326.

The light ray confined path 10 and the light output direction 11 are shown schematically.

EXAMPLE 6

Figure 11:
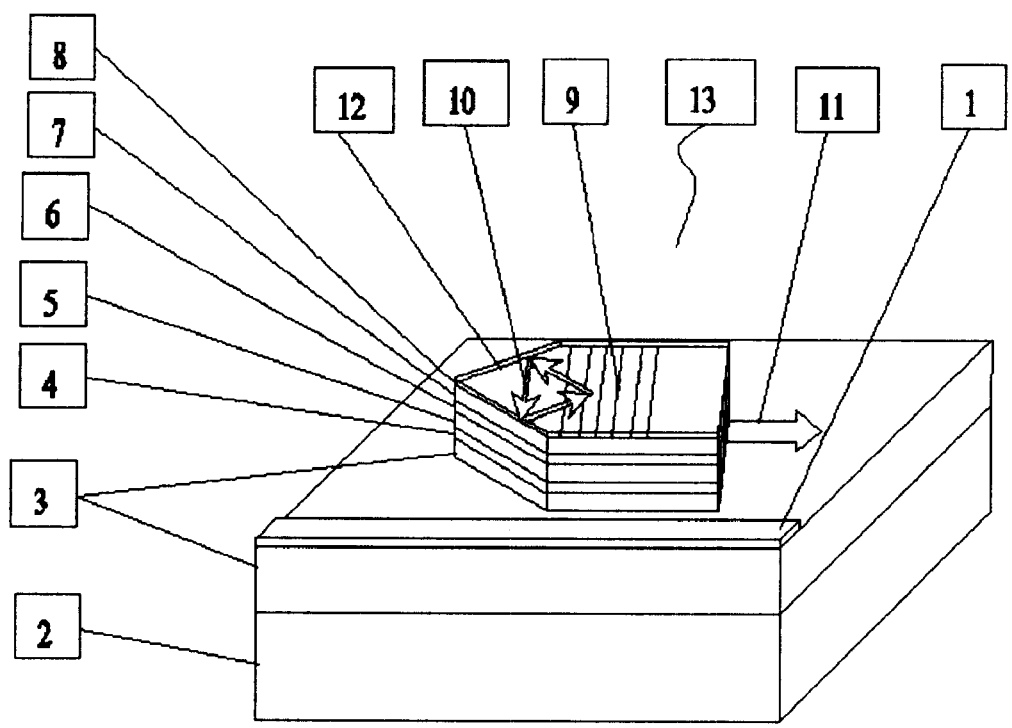
FIG. 11 exhibits another mesa-structure PGR semiconductor laser with P=R=1.

The principal scheme of mesa-structure PGR semiconductor laser with P=R=1 grown on insulating substrate and generating light with wavelength in region 400–600 nm embodied in Example 6 is shown in FIG. 11.

It is fabricated on the basis of polygonal mesa-structure etched on the surface of a semiconductor wafer and has a lower electrode 1 deposited on the top of the semiconductor structure surface in vicinity of the polygonal mesa-structure 13, an insulating sapphire substrate 2, a lower contact n-GaN layer with surface plane orientation (0001) 3, grown on sapphire substrate, a high-index InGaN two-dimensional wave-guiding layer 5, a lower wave-guiding mirror 4, made of an low-index n-type AlGaN cladding layer or n-type AlGaN superlattice, an upper wave-guiding mirror 6, made of an low-index p-type AlGaN cladding layer or p-type AlGaN superlattice, upper contact layer made of p-type AlGaN superlattice, an upper contact layer made of p-type AlGaN layer or p-type AlGaN superlattice 7, an upper contact made of thin metallic layer 8 and optical grating 9 with period given in Eqs. (7–12) made by relief etching on the surface or deposition of metal or dielectric stripes on the surface with use of lithography.

The wave-guiding layer 4 contains an active layer, made of InGaN/InGaAlN double hetero-structure, or InGaN/InGaAlN single quantum well, or InGaN/InGaAlN multiple quantum wells or current asymmetric resonance tunnelling structure stated in GB2352326.

What is claimed is:

1. A semiconductor laser with light confinement comprising:
    a lower contact layer formed on a substrate;
    an optical cavity formed above the lower contact layer for vertical light confinement, the optical cavity comprising a wave-guiding layer, the wave-guiding layer comprising an active layer;
    a surface optical grating resonator formed above the wave-guiding layer for lateral light confinement; and
    an upper contact layer formed on the surface optical grating resonator.

2. The semiconductor laser of claim 1 wherein the wave-guiding layer is substantially made of a III-V semiconductor heterostructure, a II-VI semiconductor heterostructure, a double heterostructure, an index-graded structure, or a superlattice structure.

3. The semiconductor laser of claim 1 wherein the active layer is made of a III-V semiconductor double heterostructure, a II-VI semiconductor double heterostructure, single quantum well, multiple quantum wells, or a current asymmetric resonance tunneling structure.

4. The semiconductor laser of claim 1 wherein the surface optical grating resonator is composed of a plurality of optical gratings and formed into a polygonal, circular, or elliptical shape.

5. The semiconductor laser of claim 1 wherein the surface optical grating resonator has a mesa-structure composed of a plurality of optical gratings so as to reflect light from the optical gratings and side walls of the mesa-structure.

6. A semiconductor laser with light confinement comprising:
    a lower electrode to a conducting substrate;
    a lower contact layer formed on the lower electrode;
    a lower wave-guiding mirror formed on the lower contact layer;
    a wave-guiding layer formed on the lower wave-guiding mirror, the wave-guiding layer comprising an active layer;
    an upper wave-guiding mirror formed on the wave-guiding layer;
    an upper contact layer formed on the upper wave-guiding mirror;
    a surface optical grating resonator formed on the upper contact layer; and
    an upper contact layer formed on the surface optical grating resonator.

7. The semiconductor laser of claim 6 wherein the substrate is composed of n-type GaAs, n-type InP, n-type SiC, or insulating sapphire.

8. The semiconductor laser of claim 6 wherein the lower contact layer is made of n-type GaAs, n-type InP, or n-type GaN.

9. The semiconductor laser of claim 6 wherein the lower wave-guiding mirror is made of an low-index n-type AlGaAs cladding layer, n-type AlGaAs superlattice, an low-index n-type InP cladding layer, n-type InGaAsP/InGaAsP superlattice, an n-type AlInGaAs superlattice AlGaAs cladding layer, n-type AlGaAs superlattice, a low-index n-type AlGaN cladding layer, or n-type AlGaN superlattice.

10. The semiconductor laser of claim 6 wherein the wave-guiding layer is a high-index AlGaAs two-dimensional wave-guiding layer, a high-index InGaAsP two-dimensional wave-guiding layer, or a high-index InGaN two-dimensional wave-guiding layer.

11. The semiconductor laser of claim 6 wherein the upper wave-guiding mirror is made of an low-index p-type AlGaAs cladding layer, p-type AlGaAs superlattice, an low-index p-type InP cladding layer, p-type InGaAsP superlattice, an low-index p-type AlGaN cladding layer, or p-type AlGaN superlattice.

12. The semiconductor laser of claim 6 wherein the upper contact layer is made of p-type AlGaAs, p-type InP, p-type AlGaN, or p-type AlGaN superlattice.

13. The semiconductor laser of claim 6 wherein the active layer is made of a InGaAs/GaAlAs double heterostructure, InGaAs/GaAlAs single quantum well, InGaAs/GaAlAs multiple quantum wells, a current asymmetric resonance tunneling structure, a InGaAsP/InGaAsP double heterostructure, InGaAsP/InGaAsP single quantum well, InGaAsP/InGaAsP multiple quantum wells, a GaAsSb/GaAlAs double heterostructure, an InGaAsN/GaAlAs double heterostructure, GaAsSb/GaAlAs single quantum well, InGaAsN/GaAlAs single quantum well, GaAsSb/GaAlAs multiple quantum wells, InGaAsN/GaAlAs multiple quantum wells, an InGaN/InGaAlN double heterostructure, InGaN/InGaAlN single quantum well, or InGaN/InGaAlN multiple quantum wells.

14. The semiconductor laser of claim 6 wherein the surface optical grating resonator is composed of a plurality of optical gratings and formed into a polygonal, circular, or elliptical shape by relief etching or deposition with lithography so as to generate light with wavelength in region 400–600 nm, 700–1000 nm, 1300 nm, or 1550 nm.

15. The semiconductor laser of claim 6 wherein the surface optical grating resonator has a mesa-structure composed of a plurality of optical gratings so as to reflect light from the optical gratings and side walls of the mesa-structure and generate light with wavelength in region 400–600 nm.

16. The semiconductor laser of claim 6 wherein the upper contact is made of thin metallic layer.

17. A semiconductor laser with light confinement comprising:
   a lower contact layer formed on a substrate;
   an optical cavity for vertical light confinement formed on the lower contact layer, the optical cavity comprising an active layer and a wave-guiding layer, the wave-guiding layer being formed above and below the active layer;
   a surface optical grating resonator for lateral light confinement formed on the optical cavity, the surface optical grating resonator using a polygonal, circular, or elliptical mesa structure; and
   an upper contact layer formed on the surface optical grating resonator.

18. The semiconductor laser of claim 17 wherein the optical cavity is a III-V and II-VI semiconductor heterostructure, a double heterostructure, or index-graded structure.

19. The semiconductor laser of claim 17 wherein the wave-guiding layer comprises an upper mirror and a lower mirror for vertical light confinement, the upper mirror and the lower mirror comprising a semiconducting superlattice, layered metal-dielectric interference mirrors, layered dielectric-dielectric interference mirrors, or two dielectrics with a different refraction index operating as a mirror.

20. The semiconductor laser of claim 19 wherein the lower mirror is substantially made of a low-index n-type AlGaAs cladding layer, an n-type AlGaAs superlattice, a low-index n-type InP cladding layer, an n-type InGaAsP/InGaAsP superlattice, an n-type AlInGaAs superlattice AlGaAs cladding layer, an n-type AlGaAs superlattice, a low-index n-type AlGaN cladding layer, or an n-type AlGaN superlattice.

21. The semiconductor laser of claim 19 wherein the upper mirror is substantially made of a low-index p-type AlGaAs cladding layer, a p-type AlGaAs superlattice, a low-index p-type InP cladding layer, a p-type InGaAsP superlattice, a low-index p-type AlGaN cladding layer, or a p-type AlGaN superlattice.

22. The semiconductor laser of claim 17 wherein the active layer is a III-V and II-VI semiconductor double heterostructure, a single quantum well, multiple quantum wells, or a current asymmetric resonance tunneling structure.

23. The semiconductor laser of claim 17 wherein the surface optical grating resonator comprises a plurality of optical gratings formed into a triangular, truncated triangular, polygonal, circular, or elliptical shape.

24. The semiconductor laser of claim 17 wherein the surface optical grating resonator comprises a mesa-structure comprising a plurality of optical gratings to reflect light from the optical gratings and side walls of the mesa-structure.

25. The semiconductor laser of claim 17 wherein the substrate is substantially composed of n-type GaAs, n-type InP, n-type SiC, or insulating sapphire.

26. The semiconductor laser of claim 17 wherein the lower contact layer is substantially composed of n-type GaAs, n-type InP, or n-type GaN.

27. The semiconductor laser of claim 17 wherein the wave-guiding layer is a high-index AlGaAs two-dimensional wave-guiding layer, a high-index InGaAsP two-dimensional wave-guiding layer, or a high-index InGaN two-dimensional wave-guiding layer.

28. The semiconductor laser of claim 17 wherein the upper contact layer is substantially composed of p-type AlGaAs, p-type InP, p-type AlGaN, or p-type AlGaN superlattice.

29. The semiconductor laser of claim 17 wherein the active layer comprises an InGaAs/GaAlAs double heterostructure, an InG&As/GaAlAs single quantum well, InGaAs/GaAlAs multiple quantum wells, a current asymmetric resonance tunneling structure, an InGaAsP/InGaAsP double heterostructure, an InGaAsP/InGaAsP single quantum well, InGaAsP/InGaAsP multiple quantum wells, a GaAsSb/GaAlAs double heterostructure, an InGaAsN/GaAlAs double heterostructure, a GaAsSb/GaAlAs single quantum well, an InGaAsN/GaAlAs single quantum well, GaAsSb/GaAlAs multiple quantum wells, InGaAsN/GaAlAs multiple quantum wells, an InGaN/InGaAlN double heterostructure, an InGaN/InGaAlN single quantum well, or InGaN/InGaAlN multiple quantum wells.

30. The semiconductor laser of claim 17 wherein the surface optical grating resonator comprises a plurality of optical gratings is formed into a polygonal, circular, or elliptical shape by relief etching or deposition with lithography to generate light with a wavelength of approximately 400–600 nm, 700–1000 nm, 1300 nm, or 1550 nm.

31. The semiconductor laser of claim 17 wherein the surface optical grating resonator comprises a mesa-structure comprising a plurality of optical gratings to reflect light from the optical gratings and side walls of the mesa-structure and generate light with a wavelength of approximately 400–600 nm.

32. The semiconductor laser of claim 17 further comprises a lower electrode the lower electrode forming an Ohmic contact on the lower contact layer or forming the Ohmic contact on the substrate.

33. The semiconductor laser of claim 17 wherein the upper contact layer comprises a thin metallic layer.

* * * * *